US006411173B1

(12) United States Patent
Eddy et al.

(10) Patent No.: US 6,411,173 B1
(45) Date of Patent: Jun. 25, 2002

(54) METHOD TO ACHIEVE A DC BALANCED SIGNAL DATABUS INTERFACE USING COMBINATION OF ETHERNET AND RS-485 PROTOCOLS WITH STEP-UP TRANSFORMER COUPLING

(75) Inventors: Brett A. Eddy; Jeffrey A. Kahler, both of Phoenix; Scott R. Nagy, Glendale, all of AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/207,747

(22) Filed: Dec. 8, 1998

(51) Int. Cl.[7] .................................................. H03H 5/00
(52) U.S. Cl. ............................ 333/25; 333/5; 375/258; 375/296
(58) Field of Search ................................ 370/282, 283, 370/286, 287, 288, 290, 289, 463; 333/25, 4, 5, 26, 331; 375/258, 296, 312, 319, 219, 297

(56) References Cited

U.S. PATENT DOCUMENTS

| | | | | |
|---|---|---|---|---|
| 4,555,809 A | * | 11/1985 | Carlson | 445/190 |
| 4,766,402 A | * | 8/1988 | Crane | 333/25 |
| 4,918,688 A | | 4/1990 | Krause et al. | 370/257 |
| 5,742,213 A | * | 4/1998 | Reynolds | 333/331 |
| 5,767,754 A | * | 6/1998 | Menna | 333/25 |
| 5,812,596 A | * | 9/1998 | Hunt et al. | 375/219 |
| 5,896,417 A | * | 4/1999 | Lau | 375/258 |
| 6,100,772 A | * | 8/2000 | Decramer et al. | 333/25 |

OTHER PUBLICATIONS

Maxim Integrated Products Promotional Brochure, 300MHz, Low–Power, High–Output Current, Differential Line Driver; Rev 1; Nov. 1996, pp. 1–8.

* cited by examiner

Primary Examiner—Ricky Ngo
Assistant Examiner—Phuc Tran

(57) ABSTRACT

An interface method and system for interfacing a DC unbalanced databus with a DC balanced databus suited for use in an aircraft. The system includes a DC unbalanced databus and a controller coupled to the DC unbalanced databus. An alternating DC unbalanced voltage differential signal is transmittable from the controller to a first transformer which is coupled to the controller. The alternating DC unbalanced voltage differential signal may be stepped-up and DC balanced by the first transformer to create a DC balanced voltage differential signal. A transmitter is coupled to the first transformer, where the transmitter comprises a high power differential voltage driver. The DC balanced voltage differential signal may be stepped up by the transmitter to a high drive current signal. A second transformer is coupled to the transmitter, and at least one DC balanced databus is coupled to the second transformer. A waveform shaping network may be coupled between the second transformer and DC balanced databus. A receiver may be coupled to the transmitter, second transformer, and controller. Advantages include providing a cost-effective HIRF-resistant databus where signals are transmittable for up to 300 feet.

31 Claims, 3 Drawing Sheets

METHOD TO ACHIEVE A DC BALANCED SIGNAL DATABUS INTERFACE USING COMBINATION OF ETHERNET AND RS-485 PROTOCOLS WITH STEP-UP TRANSFORMER COUPLING

TECHNICAL FIELD

This invention relates generally to databuses of communications systems and communication networks, and more particularly to aircraft databuses.

BACKGROUND OF THE INVENTION

It is common to link several computers or machines together so they can communicate with one another. A databus, or bus, is a communication channel along which data signals are transmitted between machines linked in a network. The databus may comprise one or more wires connected between various machines. If a databus is overloaded or subjected to outside influences, such as radiation, lightning, or other noise, the data signal may be disrupted or degraded, preventing or degrading its transmission.

On an aircraft, data signals from various computer systems for flight, navigation, communications, and other functions are often networked by a databus. Maintaining the integrity of data transmission over an aircraft databus is particularly important, because a failure can be disastrous. In addition, the failure of one computer system should not degrade the networking and operation of the other computer systems, and thus a firewall needs to be maintained on the aircraft.

Modern electronic communication systems operate at higher frequencies that are more susceptible to noise and other interference. A problem of prior art communication systems is that some systems, such as RS-422 standard systems, are not capable of handling high frequency signals. Other standard RS-485 systems do handle high frequency signals, but they can only transmit signals up to a maximum of 40 feet which is not long enough to cover the length of an aircraft fuselage from nose to tail, for example. Ethernet 10Base2 systems are susceptible to interference when exposed to High Intensity Radiated Fields (HIRF) because unbalanced signals are used. Attempts to minimize the HIRF effects in an Ethernet system are expensive and cumbersome because of the shielding and connectors required.

SUMMARY OF THE INVENTION

The present invention achieves technical advantages as an interface and method communicating data signals from an Ethernet DC unbalanced databus to a RS-485 compatible DC balanced databus. The present invention is a cost-effective interface system and method where signals are HIRF-resistant and transmittable up to lengths of 300 feet.

According to one embodiment, disclosed is a method of interfacing a DC unbalanced signal databus with at least one DC balanced signal databus using an interface system. The interface system has a controller coupled to a first transformer, which is coupled to a transmitter. The transmitter is a high power differential voltage driver and is coupled to a second transformer. The second transformer is coupled to the DC balanced databus, and signals are transmittable from the DC unbalanced signal databus to the DC balanced databus. The method comprises the steps of stepping up an alternating DC unbalanced voltage differential signal from the controller to a DC balanced voltage differential with the first transformer, and stepping up the DC balanced voltage differential signal from the first transformer to a high drive current signal with the transmitter. The second transformer isolates failures of the transmitter and the DC unbalanced bus from the DC balanced bus to maintain an aircraft firewall.

According to another embodiment, disclosed is an interface system for interfacing a DC unbalanced databus with at least one DC balanced databus, where the system comprises a DC unbalanced databus and a controller coupled to the DC unbalanced databus, wherein an alternating DC unbalanced voltage differential signal is transmittable from the controller. A first transformer is coupled to the controller, wherein the alternating DC unbalanced voltage differential signal may be stepped-up and DC balanced by the first transformer to create a DC balanced voltage differential signal. The system also comprises a transmitter coupled to the first transformer, where the transmitter is a high power differential voltage driver and where the DC balanced voltage differential signal may be stepped up by the transmitter to a high drive current signal. A second transformer is coupled to the transmitter, and at least one DC balanced databus is coupled to the second transformer.

Also disclosed is an interface system for bidirectionally interfacing a DC unbalanced databus. with at least one DC balanced databus, where the interface system is operable in a HIRF environment along extended distances. The system comprises a controller coupled to a DC unbalanced databus, where an alternating DC unbalanced voltage differential signal is transmittable from the controller. A first transformer is coupled to the controller, wherein the alternating DC unbalanced voltage differential signal may be stepped-up and DC balanced by the first transformer to create a DC balanced voltage differential signal. A transmitter is coupled to the first transformer, where the transmitter is capable of being disabled and also capable of being selectively tristated. The transmitter is a high power differential voltage driver, and the DC balanced voltage differential signal may be stepped up by the transmitter to a high drive current signal. A second transformer is coupled to the transmitter to provide a firewall between both the transmitter and DC unbalanced bus and the DC balanced databus. A receiver is coupled to the transmitter and the second transformer, where the receiver is capable of being disabled. A waveform shaping network is coupled to the second transformer, and at least one DC balanced databus is coupled to the second transformer. The receiver is coupled to the controller and the high drive current signal is retransmittable by the receiver to the controller.

The present invention offers technical advantages over conventional interface systems. The system and method provides a high-speed cost-effective HIRF-resistant interface system, where signals are transmittable up to 300 feet. Further advantages include low cost wiring connectors that are easy to assemble and the use of off-the-shelf components. Databuses are isolated so that failures on one part of the databus of the system do not cause failures on other parts of the databus.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

Figure 1:
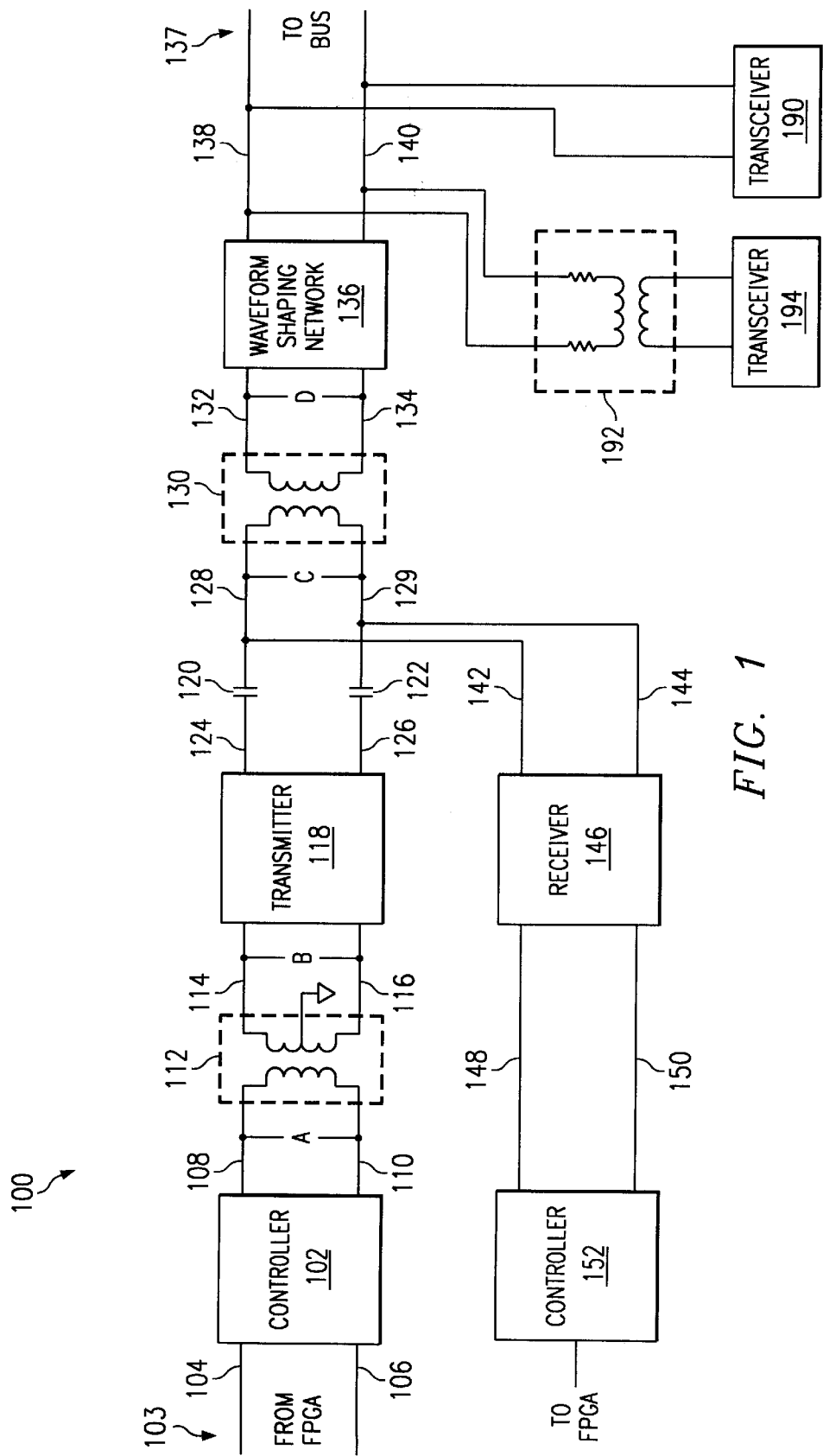
FIG. 1 illustrates a block diagram of the interface system of the present invention.

The making and use of the present preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention and do not limit the scope of the invention.

The following is a description of the system and method of the present invention. Problems of prior art databuses will be discussed first, followed by a preferred embodiment of the present invention, and a discussion of the advantages.

The system and method of the present invention may be used to interface any DC unbalanced databus to a DC balanced databus, and is especially beneficial for use on aircraft systems using an Avionics Standard Communications Bus (ASCB), for example. Prior art aircraft systems that utilize Ethernet, RS-485 and other standards have many limitations.

Ethernet 10Base2 technology is susceptible to HIRF disruptions. Ethernet receivers utilize an unbalanced pair, with one line at zero potential, and one line containing the signal having a voltage of a particular amplitude. The geometry of the cable is cylindrical: the signal line resides inside a hollow cylinder which contains the zero potential line. This geometry causes HIRF to interfere with the two lines asymmetrically, causing communication disruptions more easily than with a balanced signal pair, where both lines tend to be affected more equally. If an Ethernet coax line is further insulated from HIRF with another shield to form a triax line, a production problem is created because triax is difficult and expensive to work with. Also, using HIRF-resistant triax cable with an Ethernet system requires the use of expensive, cumbersome connectors.

The frequencies utilized in Ethernet 10Base2 are fifteen times higher than the older ASCB RS-422 baseline technology. These higher frequencies can cause attenuation in transmission lines which was not a problem in lower frequency baselines.

Also, with the Ethernet 10Base2 standard, failures are difficult or impossible to effectively isolate. Coax cable, when used, is susceptible to HIRF, lightning interference, and ground looping. Triax cable, sometimes used with an Ethernet system, is also susceptible to HIRF interference.

Furthermore, an Ethernet databus cannot be passively isolation coupled, which is especially desirable for aircraft systems. Ethernet transmissions are Manchester encoded and contain both an AC and DC component. The DC component of Ethernet transmissions cannot be passed through a passive isolation coupler because a transformer in the coupler filters out the DC component of the signal. Ethernet communications do not work when the DC component is removed. A method of using an Ethernet 10Base2 standard, while eliminating these disadvantages, is needed in the art.

Standard RS-485 solves some of the problems of the Ethernet 10Base2 system, but is so limited in power that it cannot drive a 10 MHz databus that is over 40 feet long. Standard RS-485 components provide a balanced signal that may be transmitted with twinax cable rather than coax or triax. Twinax is easier to work with, cheaper to install, and is more HIRF-resistant when a balanced signal is passed through it. Because there is no DC component of an RS-485 signal, passive bus couplers may be placed in the transmission line to provide safety isolation. However, signals transmitted using RS-485 standards are only transmittable to a maximum standard length of 40 feet at 10 Mhz. Also, short stubs are required along the RS-485 databus, and there is no provision for failure isolation.

The present invention solves these problems of the prior art. A preferred embodiment of the present invention will next be described. Referring first to FIG. 1, there is shown an interface system 100 that has a controller 102 that receives a signal from a Field Programable Gate Array (FPGA) (not shown) via DC unbalanced databus 103 comprised of lines 104 and 106. The controller 102 may comprise, for example, an Ethernet Serial Network Interface Controller (SNIC). The controller 102 is connected to a first transformer 112 by input lines 108 and 110. The signals on lines 108 and 110 may be a differential DC unbalanced signal of Ethernet 10Base2 standard centered around +0.6 volts, for example, and may be preferably Manchester encoded. The first transformer 112 is preferably a center-tapped 1:2 transformer capable of balancing a DC unbalanced signal centered around zero volts, for example, on lines 108 and 110 to a DC balanced signal on output lines 114 and 116. The center tap is grounded, as shown.

The first transformer 112 is coupled to a high power transmitter 118 by lines 114 and 116. Rather than comprising an integrated circuit rated for RS-485 standards, the transmitter 118 preferably provides a 1:2 voltage step-up and high current drive, for example, up to 125 mA. More preferably, transmitter 118 comprises a high power differential transmitter, such as a Maxim 4147 device. A plurality of parallel connected transmitters 118 (not shown) may be coupled to lines 114 and 116 if desired to provide redundant communication.

The transmitter 118 is connected to second transformer 130 and a receiver 146. The second transformer 130 is preferably a 1:1 transformer, but may have a higher or lower ratio if desired. The receiver 146 is preferably a standard RS-485 compatible receiver. Lines 124 and 126 from transmitter 118 are connected to one side of isolation capacitors 120 and 122. The other sides of the isolation capacitors 120 and 122 are coupled via lines 128 and 129 to second transformer 130 and receiver 146 by lines 142 and 144. Receiver 146 is connected to controller 152 by lines 148 and 150. Connecting the receiver 146 to the controller 152 is advantageous because it provides for a bidirectional interface system. Signals may be retransmitted from the receiver 146 to the controller 152. The controller 152 may be, for example, the same controller as controller 102. Controller 152 may be connected to an FPGA, not shown. The second transformer 130 is coupled to a waveform shaping network 136 by lines 132 and 134. The waveform shaping network 136 is connected to a DC balanced databus 137 via lines 138 and 140, as shown. The databus 137 is connected to a plurality of other computer systems, not shown. The databus 137 is preferably ASCB RS-485, for example. The second transformer 130 and isolation capacitors 120, 122 provide technical advantages by preventing short circuits of the transmitter 118 or the DC unbalanced databus from affecting the DC balanced databus 137, thereby providing a firewall. Optional bidirectional taps 190 and isolation bus coupler 192 may be coupled along the DC balanced databus 137.

Figure 2:
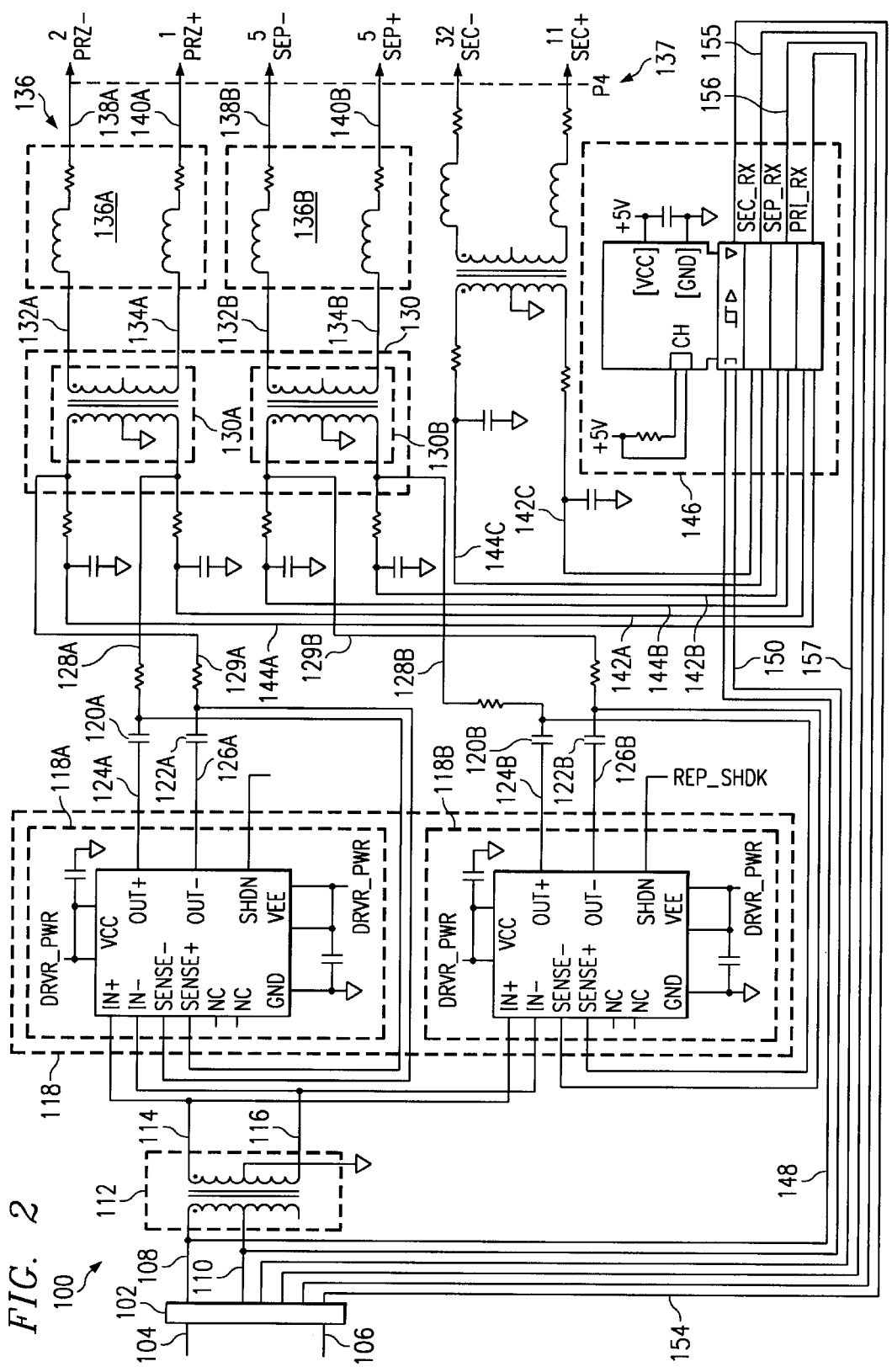
FIG. 2 is a schematic of the interface system of the present invention.

FIG. 2 is a schematic of the interface system 100 according to the present invention shown in FIG. 1, wherein like numerals refer to like elements. The interface system 100 comprises a controller 102 that receives a signal from a Field Programable Gate Array (FPGA) (not shown) on lines 104 and 106. The controller 102 is connected to a first center-tapped transformer 112 by lines 108 and 110. The first transformer 112 steps up the voltages of the input signal. The first transformer 112 is coupled to at least one high power transmitter 118 by lines 114 and 116. Preferably, the transmitter 118 may comprise a first transmitter 118A and a parallel connected second transmitter 118B, as shown, to provide redundancy in the interface system 100 and prevent system failures. For example, if first transmitter 118A fails, second transmitter 118B still sends a signal to the respective portion of the DC balanced databus 137.

Next, the portion of the schematic depicting first transmitter 118A will be described. One side of isolation capacitors 120A and 122A are coupled to the output lines 124A and 126A of the first transmitter 118A, respectively. The other side of isolation capacitors 120A and 122A are coupled with second isolation transformer 130A by lines 128A and 129A, respectively. The transmitter 118A may also be coupled to a receiver 146 by lines 142A and 144A. Second transmitter 118B is similarly coupled in the interface system 100 through isolation capacitors 120B and 122B and lines 128B and 129B to transformer 130B and receiver 146, as shown.

The receiver 146 is connected to controller 102 by lines 148, 150, 154, 155, 156 and 157. Line 154 may provide wrap-around testing (via lines 148 and 150). Lines 155, 156 and 157 bring in signals from lines 142A, 144A, 142B, 144B, 142C and 144C. The second transformer 130 (which may comprise a plurality of transformers 130A and 130B, for example) is connected to a pulse shaping network or waveform shaping network 136 by lines 132 and 134. The waveform shaping network 136 is connected to a DC balanced databus 137 via lines 138 and 140, as shown.

Figure 3:
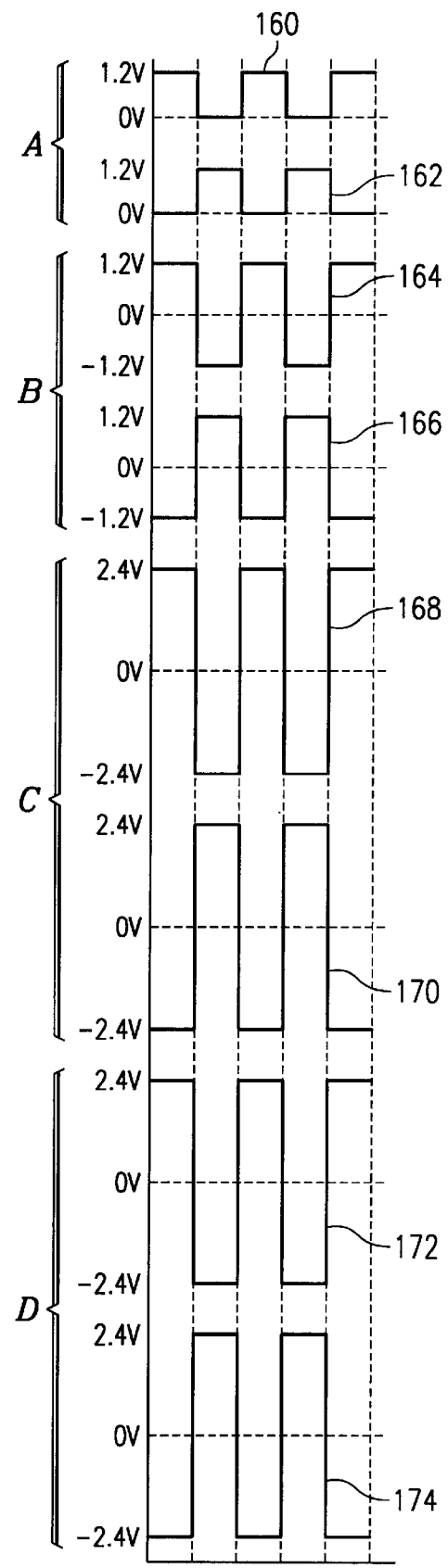
FIG. 3 is a timing diagram for signals transmitted by the present invention.

Referring now to FIG. 3, there is illustrated a timing diagram of signals that are transmitted over the interface system 100. A signal 160 and 162 at point A of FIG. 1 on lines 108 and 110, respectively, may each be, for example, a waveform alternating from 0 volts to 1.2 volts defining a DC unbalanced signal.

First transformer 112 preferably provides a 1:2 voltage step-up, and steps up the DC unbalanced signals 160 and 162 to a DC balanced signal represented as waveforms 164 and 166 at point B on lines 114 and 116, respectively. The stepped-up signals 164 and 166 at point B are DC balanced, e.g. each have approximately equal positive and negative voltages centered around 0 volts and are 180° out of phase with each other. The signals 164 and 166 at point B each have an amplitude of +1.2 volts and -1.2 volts, creating a voltage differential of 2.4 volts. The signals are then stepped up again by transmitter 118 to create signals 168 and 170 on lines 124 and 126 at point C, as shown. Preferably, the transmitter 118 provides a 1:2 voltage step-up, producing high drive current signals 168 and 170 on lines 128 and 129 that are DC balanced around 0 volts and each having an amplitude of 2.4 volts to -2.4 volts, creating a voltage differential of 4.8 volts. The signals 168 and 170 are then transmitted by second transformer 130 creating signals 172 and 174 on lines 132 and 134 at point D that are shown in FIG. 3. Second transformer 130 is preferably a 1:1 transformer, but may also provide an additional voltage step-up, or step-down, as required to adjust drive current without driving transmitter 118 into saturation. For example, second transformer 130 may provide a 0.5:1 step-up. The signals 172 and 174 on lines 132 and 134 are then passed through waveform shaping network 136 and then on to the DC balanced databus 137. The signals 132 and 134 at point D create a differential signal having voltages compatible with RS-485 standards and have a high current drive, capable of being transmitted for up to 300 feet.

An interface system according to the present invention was successfully installed using 6 db attenuation worth of 125 Ohm twinax cable, 38 simulated loads, two real loads and two bus couplers, each with 2.5 foot stubs. The interface system was then subjected to a HIRF environment with twice the HIRF levels specified in DO-160 level U while successfully maintaining communications throughout most of the required frequency range. In another test, one of the bus coupler stubs was completely shorted in a non-HIRF environment, and communications was still observed to successfully continue. Experiments of the present invention have indicated that an aircraft ASCB may be as long as 300 feet and still meet the less than 6 db attenuation requirement.

There are several other important features of the preferred present invention, which will be discussed next. RS-485 requires a high minimum signal level (300 mV) which is achieved in the present invention by the use of the high power driver and step-up transformer. During transmission, the first transformer 112 is preferably not saturated to prevent losing the signal. The step-up ratio of the first transformer may be selected to amplify the voltage more if necessary.

The interface system contains redundancies to provide an excellent firewall for the transmission of data signals on an aircraft. First and second transformers 112 and 130 not only function to step-up the signal voltage, but also provide isolation to the interface system. Placing a short across a coil of waveform shaping network 136 loads the signal but does not cause a failure. The waveform shaping network 136 is preferably based on ASCB-C. The waveform shaping network 136 filters out reflection noise.

Preferably, twinax cable is used in the interface system of the present invention, which is more HIRF-resistant than coax or triax cable. Twinax cable and isolation transformers 112 and 130 prevent ground loops from occurring in the system. The cables are preferably shielded to prevent RF emissions and susceptibility. To minimize HIRF disruptions and passively couple buses together, a balanced signal pair transmission line is used. Twinax wiring is advantageous because twinax connectors are inexpensive and easier to work with.

There are also several optional features of the present invention. For example, the transmitter 118 may be capable of being selectively tri-stated to a high output impedance, between transmissions of a signal. The transmitter 118 may also be capable of being selectively disabled to a high output impedance when the receiver 146 is not in use.

The system may further comprise from 0 to 40 bidirectional taps 190 (FIG. 1) coupled along the DC balanced databus 137. At least two of the taps may comprise isolation bus couplers 192. These passive bus couplers 192 may isolate different sections of the bus in order to maintain a firewall on the aircraft. A short circuit failure on one of the isolation buses does not prevent transmission of signals on other sections of the databus. The taps 190 are preferably coupled along the DC balanced databus 137 with twinax cable. The isolation bus couplers 192 may, for example, comprise 0 to 12 inch stubs.

The novel method and interface system of the present invention provides the advantage of achieving a DC balanced high-speed signal databus that is cost-effective and HIRF-resistant. Signals may be transmitted along the DC balanced databus 137 of the system 15 times faster than ASCB-C and 5 times faster than ARINC 629 standards of the prior art. Signals may be transmitted over a distance of up to 300 feet on the DC balanced databus 137, which is 260 feet longer than prior art RS-485 systems. The system may be bidirectional and has excellent firewall protection, particularly advantageous for use on aircraft. Databuses are isolated from one another so that failures on one part of the databus do not cause failures on other parts of the databus. The firewall may be maintained by passive bus couplers 192 that isolate different sections of the databus. The DC balanced, high-speed HIRF-resistant databus interface may be used with the Primus Epic manufactured by Honeywell Inc., for example. The present invention also uses twinax cable and low cost wiring connectors that are easy to assemble.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of interfacing a DC unbalanced signal databus with at least one DC balanced signal databus using an interface system, said interface system having a controller coupled to a first transformer; said first transformer coupled to at least a transmitter; said transmitter comprising a high power differential voltage driver and being coupled to a second transformer; said second transformer coupled to at least one said DC balanced databus, wherein signals are transmittable from said DC unbalanced signal databus to at least one said DC balanced databus, wherein said method comprises the steps of:

stepping up an alternating DC unbalanced voltage differential signal from said controller to a DC balanced voltage differential signal with said first transformer, and stepping up said DC balanced voltage differential signal from said first transformer to a high drive current signal with said transmitter.

2. The method of claim 1, wherein said method includes the step of tristating said transmitter to a high output impedance.

3. The method of claim 2 wherein said tristating step occurs between transmissions of said high drive current signal.

4. The method of claim 1 wherein said transmitter is capable of being disabled and wherein said system further comprises a receiver coupled to said transmitter, further comprising the step of disabling said transmitter when said signals are not being sent to said receiver.

5. The method of claim 1, wherein said system is bidirectional and further comprises a receiver coupled to said second transformer, further comprising the step of retransmitting said high drive current signal to said controller through said receiver.

6. The method of claim 1 wherein said high drive current signal may be transmitted and received over a range of 0 to 300 feet.

7. The method of claim 1 wherein said system further comprises from 0 to 40 bidirectional taps coupled along said DC balanced databus, wherein at least two of said taps comprise isolation bus couplers, wherein at least one short circuit failure on a part of said DC balanced databus does not prevent transmission of signals on another part of said DC balanced databus.

8. The method of claim 1 wherein said signals are transmitted along said DC balanced databuses 15 times faster than ASCB-C and 5 times faster than ARINC 629.

9. The method of claim 1 wherein said system further comprises a waveform shaping network coupled between said second transformer and said DC balanced databuses, wherein said signals are transmittable in a High Intensity Radiated Fields (HIRF) environment.

10. The method of claim 1 wherein said alternating DC unbalanced voltage differential signal is Manchester encoded, comprises a voltage of about 1.2 V and a frequency range of about 5 to 10 Mhz; wherein said step of stepping up a DC unbalanced voltage differential signal results in said DC balanced voltage differential signal having a voltage of about 2.4 V; and wherein said step of stepping up said DC balanced voltage differential signal from said first transformer results in said high drive current signal having a voltage of about 4.8 V and a current capability in the range of 0 to 125 mA.

11. An interface system for interfacing a DC unbalanced databus with at least one DC balanced databus, said system comprising:

a controller couplable to said DC unbalanced databus, wherein an alternating DC unbalanced voltage differential signal is transmittable from said controller;

a first transformer coupled to said controller, wherein said alternating DC unbalanced voltage differential signal may be stepped-up and DC balanced by said first transformer to create a DC balanced voltage differential signal;

at least a transmitter coupled to said first transformer, wherein said transmitter comprises a high power differential voltage driver, wherein said DC balanced voltage differential signal may be stepped up by said transmitter to a high drive current signal; and a second transformer coupled to said transmitter and couplable to said DC balanced databus.

12. The interface system of claim 11, further comprising a waveform shaping network coupled between said second transformer and said DC balanced databus, wherein said interface system is operable in a High Intensity Radiated Fields (HIRF) environment.

13. The interface system of claim 11 wherein said transmitter comprises a Maxim 4147 transmitter, and wherein said controller comprises an Ethernet Serial Network Interface Controller (SNIC).

14. The interface system of claim 11 wherein said alternating DC unbalanced voltage differential signal is Manchester encoded, comprises a voltage of about 1.2 V and a frequency range of about 5 to 10 Mhz; wherein said DC balanced voltage differential signal has a voltage of about 2.4 V; and wherein said high drive current signal has a voltage of about 4.8 V and a current capability in the range of 0 to 125 mA.

15. The interface system of claim 11 wherein said high drive current signal is transmittable along said DC balanced databus for a distance of 0 to 300 feet.

16. The interface system of claim 11 wherein said DC unbalanced databus and DC balanced databus comprise aircraft databuses.

17. The interface system of claim 11, further comprising a Field Programmable Gate Array (FPGA) coupled to said controller.

18. The interface system of claim 11, further comprising a receiver between said transmitter and said controller, wherein said receiver is capable of being selectively disabled.

19. The interface system of claim 18, wherein said high drive current signal is retransmittable by said receiver to said controller.

20. The interface system of claim 18, wherein said receiver comprises a RS-485 receiver.

21. The interface system of claim 11, further comprising at least one DC balanced databus coupled to said second transformer, and further comprising 0 to 40 bidirectional taps coupled along said DC balanced databus.

22. The interface system of claim 21, wherein said taps are coupled along said DC balanced databus with twinax cable.

23. The interface system of claim 21, wherein at least two of said taps comprise isolation bus couplers, wherein said isolation bus couplers comprise 0 to 12 inch stubs.

24. The interface system of claim 23 wherein a short circuit failure on at least a part of said DC balanced databus does not prevent transmission of signals on another part of said DC balanced databus.

25. The interface system of claim 11, wherein signals are transmitted along said DC balanced databus 15 times faster than ASCB-C and 5 times faster than ARINC 629.

26. The interface system of claim 11, further comprising an isolation capacitor coupled between said transmitter and said second transformer and said receiver.

27. The interface system of claim 11, wherein said transmitter is capable of being disabled and selectively tristated.

28. An interface system for bidirectionally interfacing a DC unbalanced databus with at least one DC balanced databus, said interface system being operable in a HIRF environment, wherein said system comprises:

a DC unbalanced databus;

a controller coupled to said DC unbalanced databus, wherein an alternating DC unbalanced voltage differential signal is transmittable from said controller;

a first transformer coupled to said controller, wherein said alternating DC unbalanced voltage differential signal may be stepped-up and DC balanced by said first transformer to create a DC balanced voltage differential signal;

at least a transmitter coupled to said first transformer, said transmitter being capable of being disabled and selectively tristated, wherein said transmitter comprises a high power differential voltage driver, wherein said DC balanced voltage differential signal may be stepped up by said transmitter to a high drive current signal;

a second transformer coupled to said transmitter;

a receiver coupled to said transmitter and said second transformer, wherein said receiver is capable of being disabled;

a waveform shaping network coupled to said second transformer; and at least one DC balanced databus coupled to said second transformer;

wherein said receiver is coupled to said controller, wherein said high drive current signal is retransmittable by said receiver to said controller.

29. The interface system of claim 28, wherein said transmitter comprises a Maxim 4147 transmitter, wherein said controller comprises an Ethernet Serial Network Interface Controller (SNIC), and wherein said receiver comprises a RS-485 receiver.

30. The interface system of claim 28 further comprising 0 to 40 bidirectional taps coupled with twinax cable along at least a said DC balanced databus.

31. The interface system of claim 30, wherein at least two of said taps comprise isolation bus couplers, said isolation bus couplers comprise 0 to 12 inch stubs, wherein a short circuit failure on at least a part of said DC balanced databus does not prevent transmission of signals on another part of said DC balanced databus.

* * * * *